United States Patent
Zhang et al.

(10) Patent No.: US 8,921,938 B1
(45) Date of Patent: Dec. 30, 2014

(54) LATERALLY DIFFUSED METAL OXIDE SEMICONDUCTOR (LDMOS) DEVICE WITH OVERLAPPING WELLS

(71) Applicant: Marvell International Ltd., Hamilton (BM)

(72) Inventors: Xin Yi Zhang, Cupertino, CA (US); Weidan Li, San Jose, CA (US); Chuan-Cheng Cheng, Fremont, CA (US); Jian-Hung Lee, San Jose, CA (US); Chung Chyung (Jason) Han, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 13/766,591

(22) Filed: Feb. 13, 2013

Related U.S. Application Data (63) Continuation of application No. 12/718,859, filed on Mar. 5, 2010, now abandoned.

(60) Provisional application No. 61/159,231, filed on Mar. 11, 2009.

(51) Int. Cl.
  *H01L 29/66* (2006.01)
  *H01L 21/22* (2006.01)
  *H01L 21/38* (2006.01)
  *H01L 29/78* (2006.01)

(52) U.S. Cl.
  CPC .................... *H01L 29/7816* (2013.01)
  USPC ...... 257/343; 438/545; 438/546; 257/E29.256

(58) Field of Classification Search
  USPC .................... 257/343; 438/545, 546
  See application file for complete search history.

(56) References Cited

U.S. PATENT DOCUMENTS

| | | | | |
|---|---|---|---|---|
| 6,521,946 B2 * | 2/2003 | Mosher | .......................... | 257/336 |
| 6,639,284 B1 * | 10/2003 | Chatterjee et al. | ............ | 257/355 |
| 2006/0001086 A1 * | 1/2006 | Pendharkar | ................... | 257/335 |
| 2008/0211026 A1 | 9/2008 | Chou et al. | | |
| 2009/0315110 A1 * | 12/2009 | Vashchenko | ................... | 257/344 |

* cited by examiner

*Primary Examiner* — Daniel Luke (57) ABSTRACT

Some of the embodiments of the present disclosure provide a transistor comprising a p-type well; and an n-type well; wherein at least a part of one of the p-type well and the n-type well overlaps with at least a part of another of the p-type well and the n-type well. Other embodiments are also described and claimed.

16 Claims, 7 Drawing Sheets

LATERALLY DIFFUSED METAL OXIDE SEMICONDUCTOR (LDMOS) DEVICE WITH OVERLAPPING WELLS

CROSS REFERENCE TO RELATED APPLICATIONS

The present disclosure is a continuation of and claims priority to U.S. patent application Ser. No. 12/718,859, filed Mar. 5, 2010, which claims priority to U.S. Patent Application No. 61/159,231, filed Mar. 11, 2009, which are incorporated herein by reference.

TECHNICAL FIELD

Embodiments of the present invention relate to laterally diffused metal oxide semiconductor (LDMOS) devices, and more specifically, to LDMOS devices with overlapping wells.

BACKGROUND

Figure 1:
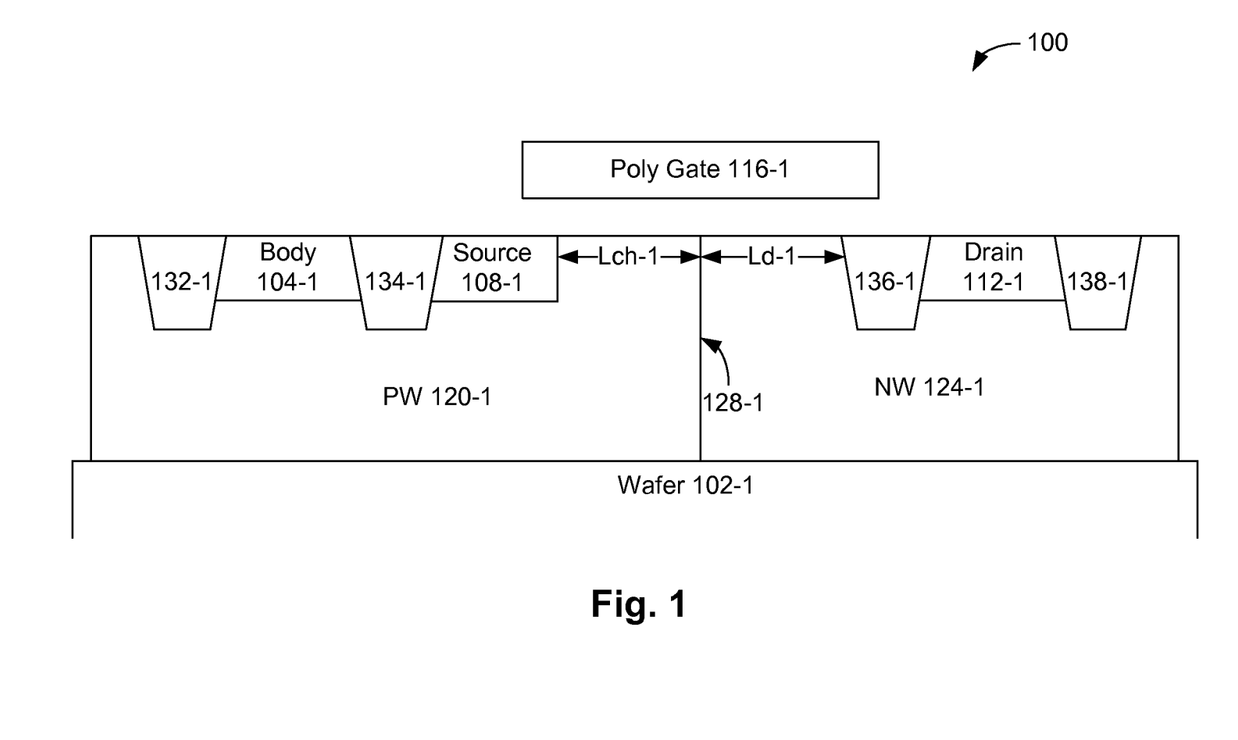
FIG. 1 schematically illustrates a cross sectional view of an LDNMOS transistor.

Laterally diffused metal oxide semiconductor (LDMOS) devices are generally used in high voltage applications. FIG. 1 schematically illustrates a cross sectional view of a laterally diffused n-type metal oxide semiconductor (LDNMOS) transistor 100 (also referred to herein as LDNMOS 100). LDNMOS 100 is formed on a semiconductor wafer 102-1. P-type well (also referred to herein as PW) 120-1 and n-type well (also referred to herein as NW) 124-1 are formed on the wafer 102-1. A junction between PW 120-1 and NW 124-1 is labeled as 128-1 in FIG. 1.

LDNMOS 100 includes body region 104-1, source region 108-1, drain region 112-1, and poly gate 116-1. The LDNMOS 100 also includes shallow trench isolation (STI) regions 132-1, 134-1, 136-1 and 138-1. Although not illustrated in FIG. 1, the poly gate 116-1 is coupled to one or more other components of the LDNMOS 100 (e.g., to portions of the source region 108-1, PW 120-1, NW 124-1, and/or STI region 136-1) through one or more layers (e.g., a gate oxide layer).

A channel is formed in PW 120-1 between the source region 108-1 and the junction 128-1. A width of the channel is indicated as Lch-1. Also, an extension of the NW 124-1, between the STI region 136-1 and the junction 128-1, is marked as Ld-1.

Although the LDNMOS 100 exhibits high voltage tolerance, in various applications, it is desirable to further increase the voltage tolerance of the LDNMOS device 100. Such relatively high voltage tolerance may make the LDNMOS device suitable for even higher voltage applications.

The description in this section is related art, and does not necessarily include information disclosed under 37 C.F.R. 1.97 and 37 C.F.R. 1.98. Unless specifically denoted as prior art, it is not admitted that any description of related art is prior art.

SUMMARY

In various embodiments, the present disclosure provides a transistor comprising a p-type well; and an n-type well; wherein at least a part of one of the p-type well and the n-type well overlaps with at least a part of another of the p-type well and the n-type well. In various embodiments, at least the part of one of the p-type well and the n-type well overlaps with at least the part of another of the p-type well and the n-type well to form an overlapping region. The transistor may be a laterally diffused metal oxide semiconductor (LDMOS) transistor (e.g., a laterally diffused n-type metal oxide semiconductor (LDNMOS) transistor or a laterally diffused p-type metal oxide semiconductor (LDPMOS) transistor).

In various embodiments, there is also provided a method for forming a transistor, the method comprising forming a p-type well; and forming an n-type well; wherein forming the p-type well or forming the n-type well further comprises extending at least a part of one of the p-type well and n-type well to overlap with at least a part of another of the p-type well and the n-type well, thereby forming an overlapping region. Forming the p-type well or forming the n-type well further comprises extending at least the part of the p-type well to overlap with at least the part of the n-type well. Forming the p-type well or forming the n-type well further comprises extending at least the part of the n-type well to overlap with at least the part of the p-type well.

In various embodiments, there is also provided a semiconductor device comprising a p-type well that includes a p-type dopant specie; an n-type well that includes an n-type dopant specie; and an overlapping region formed between the p-type well and n-type well, the overlapping region including the p-type dopant specie and the n-type dopant specie. The semiconductor device may be a laterally diffused n-type metal oxide semiconductor (LDNMOS) transistor or a laterally diffused p-type metal oxide semiconductor (LDPMOS) transistor.

BRIEF DESCRIPTION OF THE DRAWINGS

In the following detailed description, reference is made to the accompanying drawings which form a part hereof wherein like numerals designate like parts throughout, and in which is shown by way of illustration embodiments in which the invention may be practiced. It is to be understood that other embodiments may be utilized and structural or logical changes may be made without departing from the scope of the present invention. Therefore, the following detailed description is not to be taken in a limiting sense, and the scope of embodiments in accordance with the present invention is defined by the appended claims and their equivalents.

DETAILED DESCRIPTION

In the following detailed description, reference is made to the accompanying drawings which form a part hereof wherein like numerals designate like parts throughout, and in which is shown by way of illustration embodiments in which the invention may be practiced. It is to be understood that other embodiments may be utilized and structural or logical changes may be made without departing from the scope of the present invention. Therefore, the following detailed description is not to be taken in a limiting sense, and the scope of embodiments is defined by the appended claims and their equivalents.

Various operations may be described as multiple discrete operations in turn, in a manner that may be helpful in understanding embodiments of the present invention; however, the order of description should not be construed to imply that these operations are order dependent.

The description may use the phrases "in an embodiment," or "in embodiments," which may each refer to one or more of the same or different embodiments. The phrase "in some embodiments" is used repeatedly. The phrase generally does not refer to the same embodiments; however, it may. The terms "comprising," "having," and "including" are synonymous, unless the context dictates otherwise. The phrase "A and/or B" means (A), (B), or (A and B). The phrase "A/B" means (A), (B), or (A and B), similar to the phrase "A and/or B." The phrase "at least one of A, B and C" means (A), (B), (C), (A and B), (A and C), (B and C) or (A, B and C). The phrase "(A) B" means (B) or (A and B), that is, A is optional.

Figure 2:
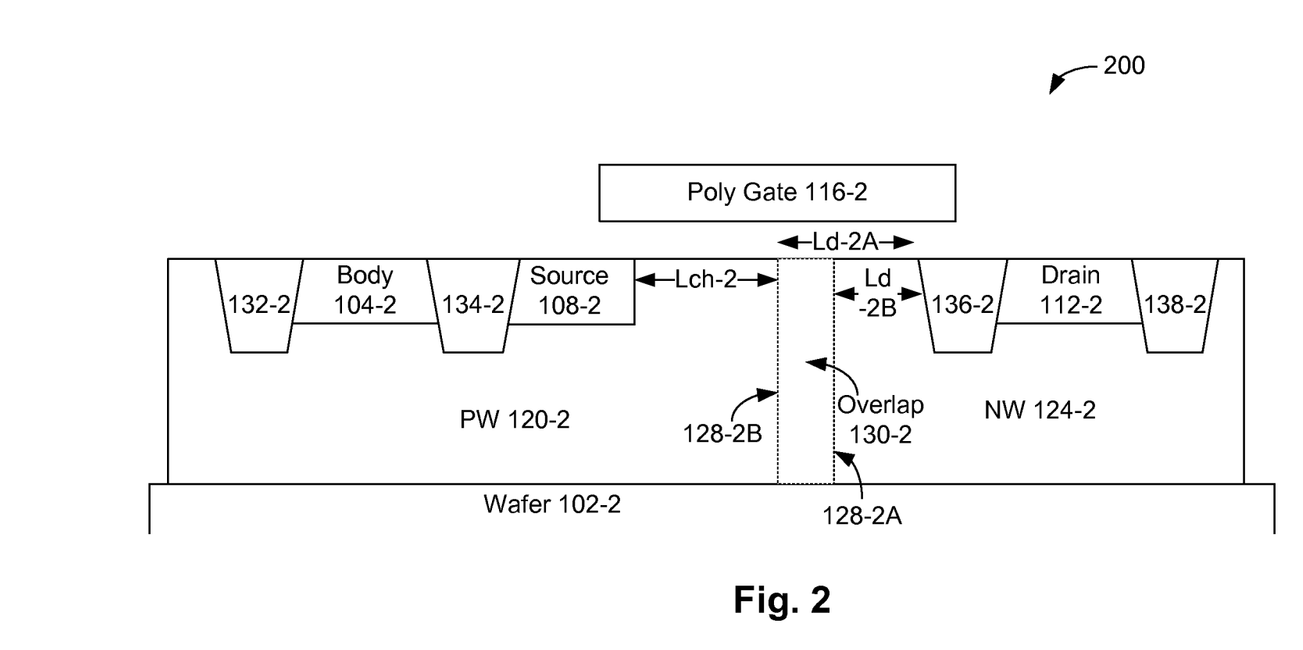
FIGS. 2, 2A and 2B schematically illustrate cross sectional views of LDNMOS transistors, in accordance with various embodiments of the present disclosure.

FIG. 2 schematically illustrates a cross sectional view of an LDNMOS transistor 200 (also referred to herein as LDNMOS 200), in accordance with various embodiments of the present disclosure. One or more components of the LDNMOS 200 are at least in part similar to corresponding components of the LDNMOS 100 of FIG. 1. For example, the semiconductor wafer 102-2, body region 104-2, source region 108-2, drain region 112-2, poly gate 116-2, and/or STI regions 132-2, 134-2, 136-2 and 138-2 of LDNMOS 200 are at least in part similar to corresponding components of the LDNMOS 100 of FIG. 1. The STI region 134-2 provides dielectric isolation between the body region 104-2 and the source region 108-2. Furthermore, the STI region 136-2 straddles the gate-drain edge of the LDNMOS 200. Although not illustrated in FIG. 2, in various embodiments, one or more of the STI regions 132-2, 134-2, 136-2 and 138-2 (e.g., STI region 134-2) may be absent from the LDNMOS 200.

The LDNMOS 200 also includes PW 120-2 and NW 124-2 formed on the wafer 102-2. Any appropriate p-type dopant specie (e.g., boron, and/or the like) may be used to form the PW 120-2. Similarly, any appropriate n-type dopant specie (e.g., arsenic, phosphorus, and/or the like) may be used to form the NW 124-2. The body region 104-2, source region 108-2, and STI regions 132-2 and 134-2 are formed on PW 120-2, whereas the drain region 112-2 and STI regions 136-2 and 138-2 are formed on NW 124-2.

The LDNMOS 200 also includes an overlapping region 130-2. In various embodiments, the overlapping region 130-2 is a part of NW 124-2, in which the PW 120-2 has been extended. That is, the overlapping region 130-2 is formed by extending the PW 120-2 to the NW 124-2.

For example, in various embodiments, appropriate n-type dopant specie (e.g., dopant specie used for NW 124-2) may be introduced in the overlapping region 130-2 (e.g., along with being introduced in NW 124-2). Subsequently, appropriate p-type dopant specie (e.g., dopant specie used for PW 120-2) may be introduced in the overlapping region 130-2 (e.g., along with being introduced in PW 120-2). Alternatively, in various other embodiments, p-type dopant specie may be introduced before (or at least partially concurrently with) introduction of the n-type dopant specie in the overlapping region 130-2.

A junction between the NW 124-2 and the overlapping region 130-2 is labeled as 128-2A in FIG. 2. Another junction between the PW 120-2 and the overlapping region 130-2 is labeled as 128-2B in FIG. 2.

A channel is formed in PW 120-2, between the source region 108-2 and the junction 128-2B. A width of the channel is indicated as Lch2. Also, an extension of the NW 124-2, between the STI region 136-2 and the junction 128-2A, is indicated as Ld-2B. The width between the STI region 136-2 and the junction 128-2B is indicated as Ld-2A.

Thus, the original width of the NW 124-2 (between STI region 136-2 and the PW 120-2), without the overlapping region 130-2, is Ld-2A. However, due to the overlapping region 130-2, this width decreases to Ld-2B. That is, due to the extension of the PW 120-2 in the NW 124-2 (i.e., due to formation of the overlapping region 130-2), the width of the NW 124-2 decreases by ((Ld-2A)−(Ld-2B)), which is equal to the width of the overlapping region 130-2.

Extending the PW 120-2 into the NW 124-2 in the overlapping region 130-2 results in the overlapping region 130-2 being relatively lightly doped compared to the NW 124-2. In various embodiments, the reduced doping level in the overlapping region 130-2 allows the potential of the LDNMOS 200 to be raised higher, without substantially degrading the performance of the LDNMOS 200, thereby resulting in a higher voltage tolerance level of the LDNMOS 200. The intentional overlapping of the NW and PW regions allows to modulate the channel width, and also modulate (e.g., increase) a maximum voltage tolerance level of the LDNMOS 200.

The width of the overlapping region 130-2 may be based on various factors, including but not limited to the lengths Lch-2 and Ld-2A, desired maximum voltage tolerance level of the transistor, desired switching resistance Rdson, desired snap-back voltage Vsb, threshold voltage Vt, desired drain voltage threshold level, and/or the like.

In an example, for Lch-2 of about 0.54 micro-meters (μm) and Ld-2A of about 0.46 μm, the width of the overlapping region 130 may be about 0.1 μm, 0.3 μm, or any other appropriate length between 0 and 0.46 μm. In the case the width of the overlapping region 130 is between 0 and 0.46 μm, the extension of PW 120-2, into the NW 124-2, stops before the PW-120-2 reaches the STI region 136-2. Thus, in various embodiments, a part of the NW 124-2 separates the overlapping region 130-2 from the STI region 136-2.

Figure 2A:
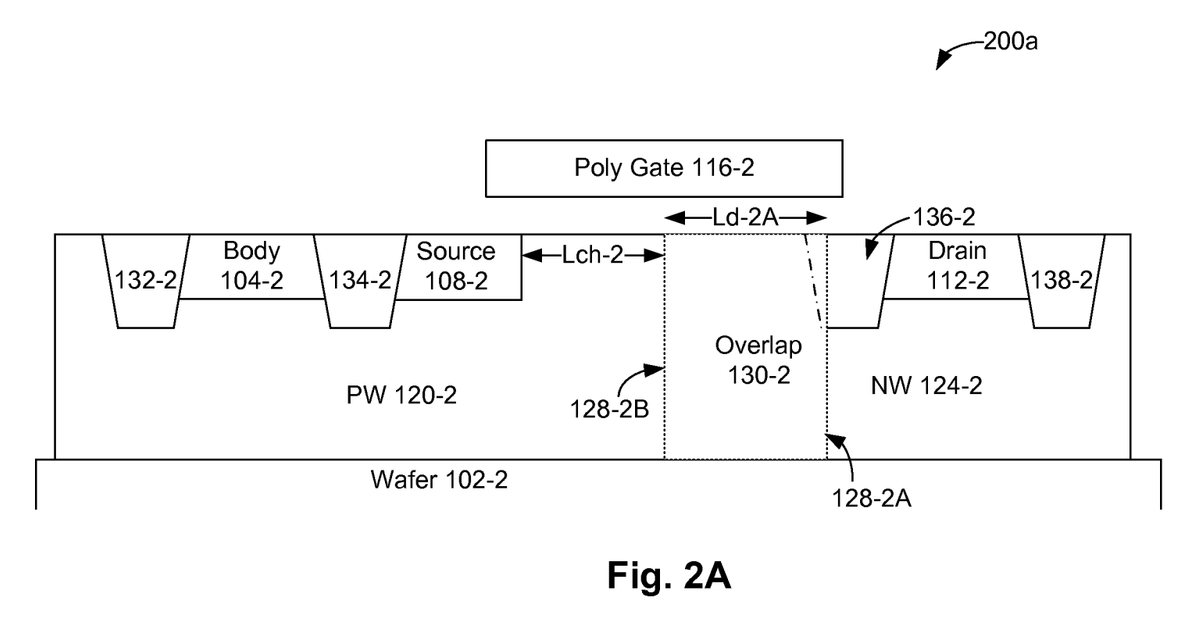
Figure 2B:
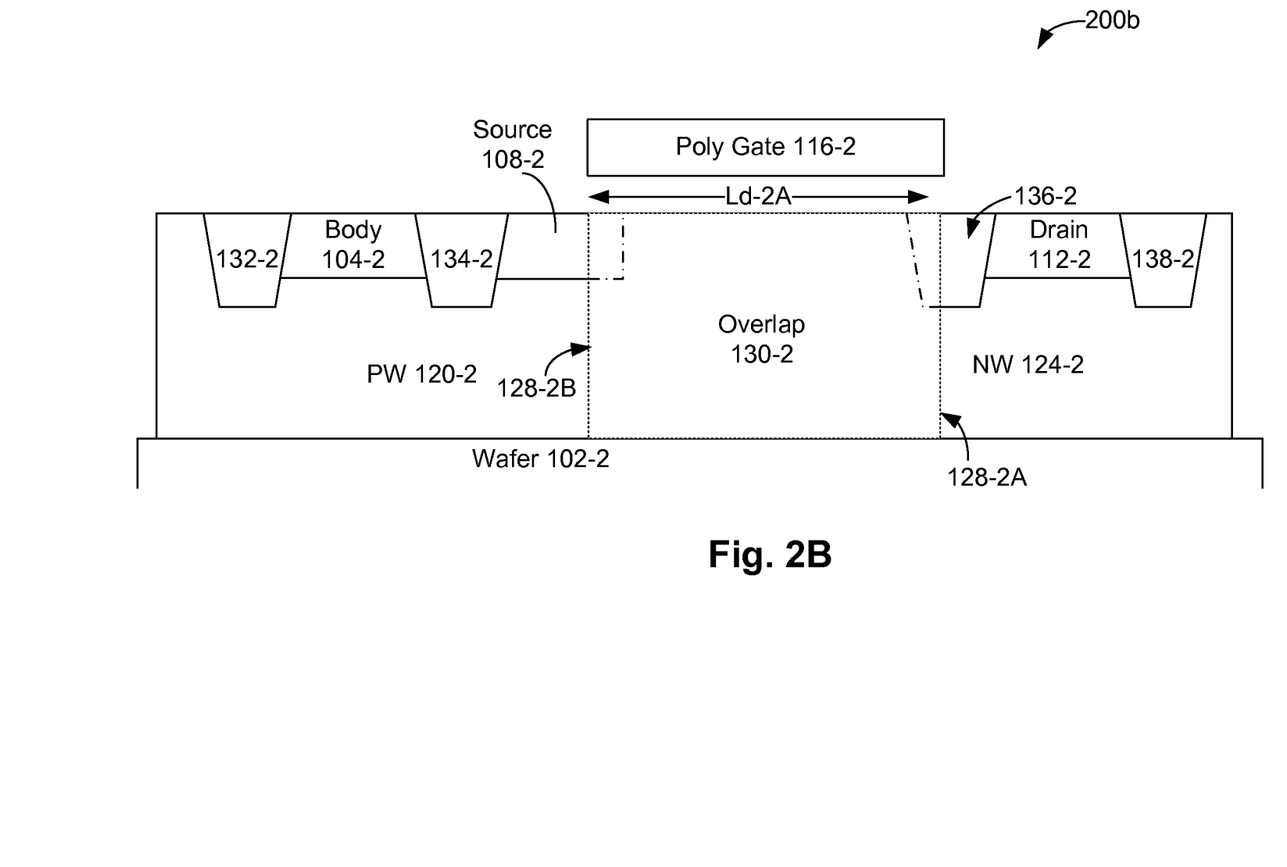

In various other embodiments, the width of the overlapping region 130-2 is more than Ld-2A. For example, the width of the overlapping region 130-2 may be about 0.66 μm, which is more than the length Ld-2A (which is equal to 0.46 μm). In these embodiments, the overlapping region 130-2 partially covers the STI region 136-2, and may even cover the entire region below the poly gate 116-2. For example, FIG. 2A schematically illustrates a cross sectional view of an LDNMOS transistor 200a, in accordance with various embodiments of the present disclosure. The transistor 200a illustrated in FIG. 2A is similar to the transistor 200 illustrated in FIG. 2 (e.g., both the figures have similar reference labels); however, in the transistor 200a illustrated in FIG. 2A, the overlapping region 130-2 partially covers the STI region 136-2. In another example, FIG. 2B schematically illustrates a cross sectional view of an LDNMOS transistor 200b, in accordance with various embodiments of the present disclosure. The transistor 200b illustrated in FIG. 2B is similar to the transistor 200 illustrated in FIG. 2 (e.g., both the figures have similar reference labels); however, in the transistor 200b illustrated in FIG. 2B, the overlapping region 130-2 covers the entire region below the poly gate 116-2.

In various embodiments, because of the overlapping region 130-2, drain voltage Vd of the LDNMOS 200 may be increased (e.g., increased at least up to 8V), without a breakdown in the drain current Id. In various embodiments, this increased drain voltage Vd of the LDNMOS 200 may be higher than that of the LDMOS 100 of FIG. 1. The threshold voltage Vt of the LDNMOS 200 increases with an increase in the width of the overlapping region 130-2. Accordingly, the threshold voltage Vt of the LDNMOS 200 may be relatively higher than that of the LDMOS 100 of FIG. 1. Although the overlapping region 130-2 increases switching resistance Rdson, the increase is not significant for a reasonable width of the overlapping region 130-2. For example, the increase in Rdson is not significant for a width of the overlapping region 130-2 that is less than Ld-2A. Also, as the doping is reduced at the drain junction by the overlapping region 130-2, snapback voltage Vsb of the LDNMOS 200 improves, based at least in part on the width of the overlapping region 130-2.

Accordingly, because of the introduction of the overlapping region 130-2, the LDNMOS 200 of FIG. 2 may be suitable for relatively higher voltage applications, as compared to the LDNMOS 100 of FIG. 1.

While in the LDNMOS 200 the PW 120-2 is extended into NW 124-2 to form the overlapping region 130-2, in various other embodiments, the NW 124-2 may also be extended into the PW 120-2 to form an overlapping region. For example, FIG. 3 schematically illustrates a cross sectional view of another LDNMOS transistor 300 (also referred to herein as LDNMOS 300) in which an NW is extended in a PW to form an overlapping region, in accordance with various embodiments of the present disclosure.

Figure 3:
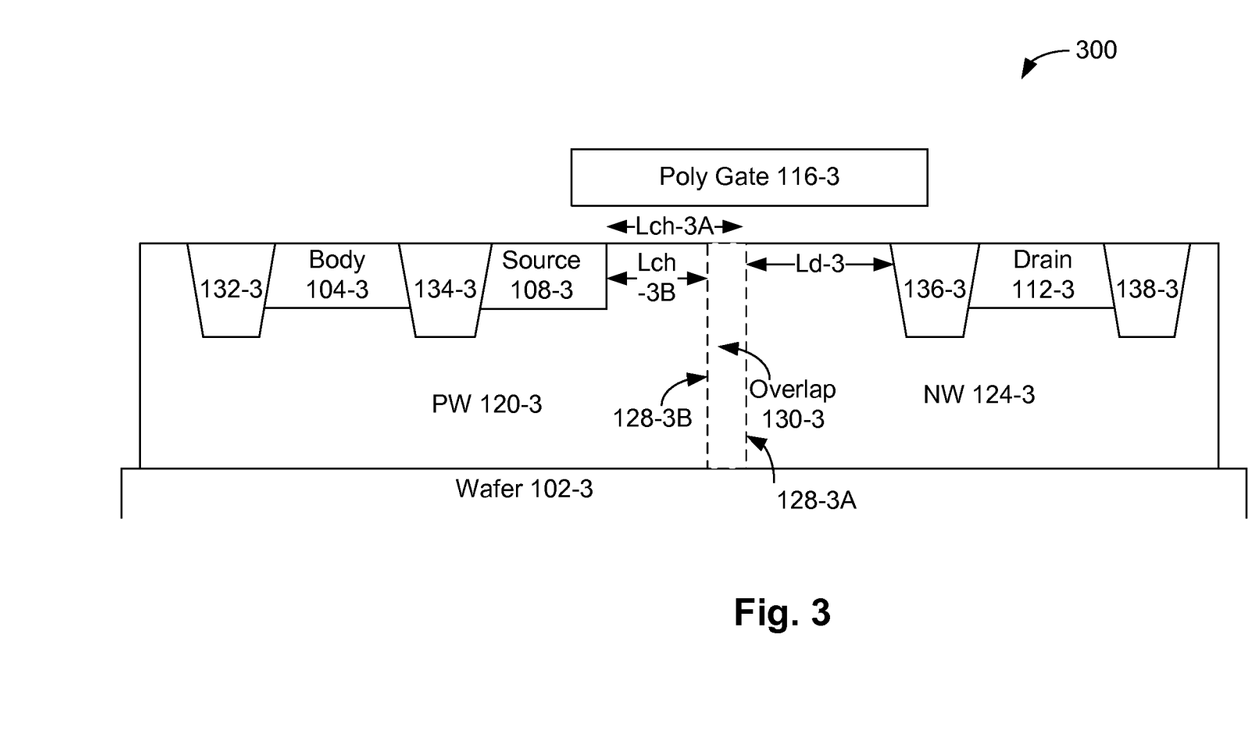
FIG. 3 schematically illustrates a cross sectional view of another LDNMOS transistor in which an N-type well is extended in a P-type well, in accordance with various embodiments of the present disclosure.

One or more components of the LDNMOS 300 of FIG. 3 are at least in part similar to corresponding components of the LDNMOS 200 of FIG. 2. For example, the semiconductor wafer 102-3, body region 104-3, source region 108-3, drain region 112-3, poly gate 116-3, junctions 128-3A and 3B, and/or STI regions 132-3, 134-3, 136-3 and 138-3 of LDNMOS 300 are at least in part similar to corresponding components of the LDNMOS 200 of FIG. 2.

The LDNMOS 300 also includes PW 120-3 and NW 124-3 formed on the wafer 102-3. The LDNMOS 300 further includes an overlapping region 130-3. In various embodiments, the overlapping region 130-3 is a part of PW 120-3, to which the NW 120-3 has been extended. That is, the overlapping region 130-3 is formed by extending the NW 124-3 to the PW 120-3. For example, appropriate p-type dopant specie (e.g., dopant specie used for PW 120-3) may be introduced in the overlapping region 130-3 (e.g., along with being introduced in PW 120-3), concurrently with (e.g., at least partially concurrently with), prior to, or subsequent to introducing appropriate n-type dopant specie (e.g., dopant specie used for NW 124-3) in the overlapping region 130-3 (e.g., along with being introduced in NW 124-3).

A width of the channel between the source region 108-3 and the junction 128-3B is indicated as Lch-3B. Also, an extension of the NW 124-3, between the STI region 136-3 and the junction 128-3A, is indicated as Ld-3. The width between source region 108-3 and the junction 128-3A is indicated as Lch-3A.

Thus, the original width of the PW 120-3 (between source region 108-3 and the NW 124-3), without the overlapping region 130-3, is Lch-3A. However, due to the overlapping region 130-3, this width decreases to Lch-3B. That is, due to the extension of the NW 124-3 in the PW 120-3 (i.e., due to formation of the overlapping region 130-3), the width of the PW 120-3 decreases by ((Lch-3A)–(Lch-3B)), which is equal to the width of the overlapping region 130-3.

In various embodiments, extending the NW 124-3 into the PW 120-3 in the LDNMOS 300 (thereby forming the overlapping region 130-3) has various advantages over the conventional LDNMOS 100. Some of these advantages may be similar to those discussed with respect to the LDNMOS 200 of FIG. 2.

Figure 4:
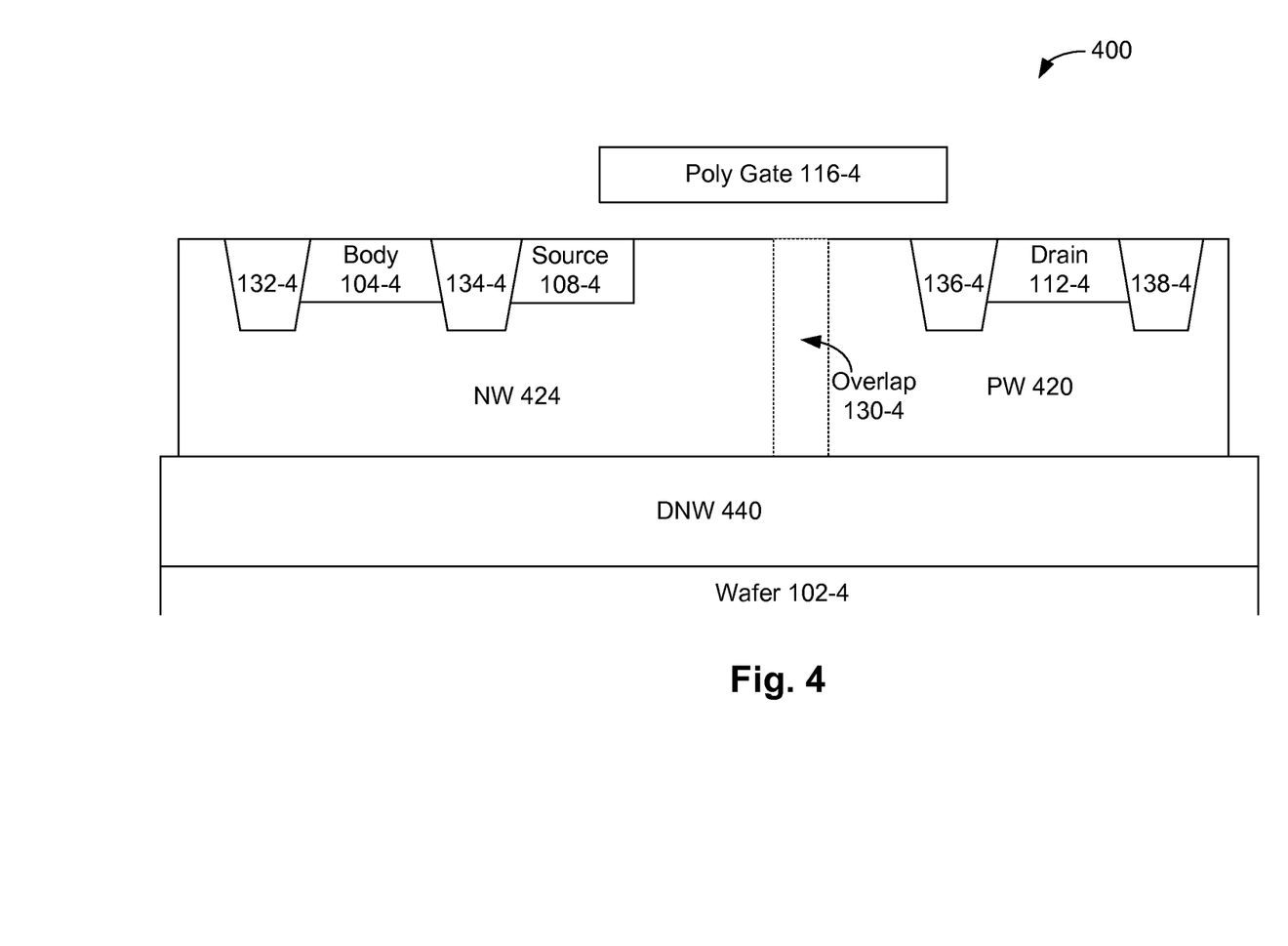
FIG. 4 schematically illustrates a cross sectional view of a laterally diffused p-type metal oxide semiconductor (LDPMOS) transistor, in accordance with various embodiments of the present disclosure.

Although FIGS. 2 and 3 illustrate overlapping regions in LDNMOS devices, the concept of overlapping PWs and NWs may be applied to various other types of transistors (e.g., one or more other transistors that are based on complementary metal oxide semiconductor (CMOS) process), as will be readily understood by those skilled in the art based at least in part on the teachings of this disclosure. For example, FIG. 4 schematically illustrates a cross sectional view of a laterally diffused p-type metal oxide semiconductor (LDPMOS) transistor 400 (also referred to herein as LDPMOS 400), in accordance with various embodiments of the present disclosure.

One or more components of the LDPMOS 400 are at least in part similar to corresponding components of the LDNMOS 200 of FIG. 2. For example, the semiconductor wafer 102-4, body region 104-4, source region 108-4, drain region 112-4, poly gate 116-4, and/or STI regions 132-4, 134-4, 136-4 and 138-4 of LDPMOS 400 are at least in part similar to corresponding components of the LDNMOS 200 of FIG. 2.

LDPMOS 400 also includes PW 420 and NW 424. However, unlike LDNMOS 200 of FIG. 2, the body region 104-4, source region 108-4, and STI regions 132-4 and 134-4 are formed on NW 424. Also, the drain region 112-4 and STI regions 136-4 and 138-4 are formed on PW 420. In various embodiments, the NW 424 and the PW 420 are formed on a deep n-well (DNW) 440.

The LDPMOS 400 also includes an overlapping region 130-4. In various embodiments, the overlapping region 130-4 is formed either by extending the PW 420 into the NW 424, or by extending the NW 424 into the PW 420, as will be readily understood by those skilled in the art based at least in part on the teachings of this disclosure.

In various embodiments, forming the overlapping region 130-4 in the LDPMOS 400 has various advantages over a conventional LDPMOS. Some of these advantages may be similar to those discussed with respect to the LDNMOS 200 of FIG. 2.

Figure 5:
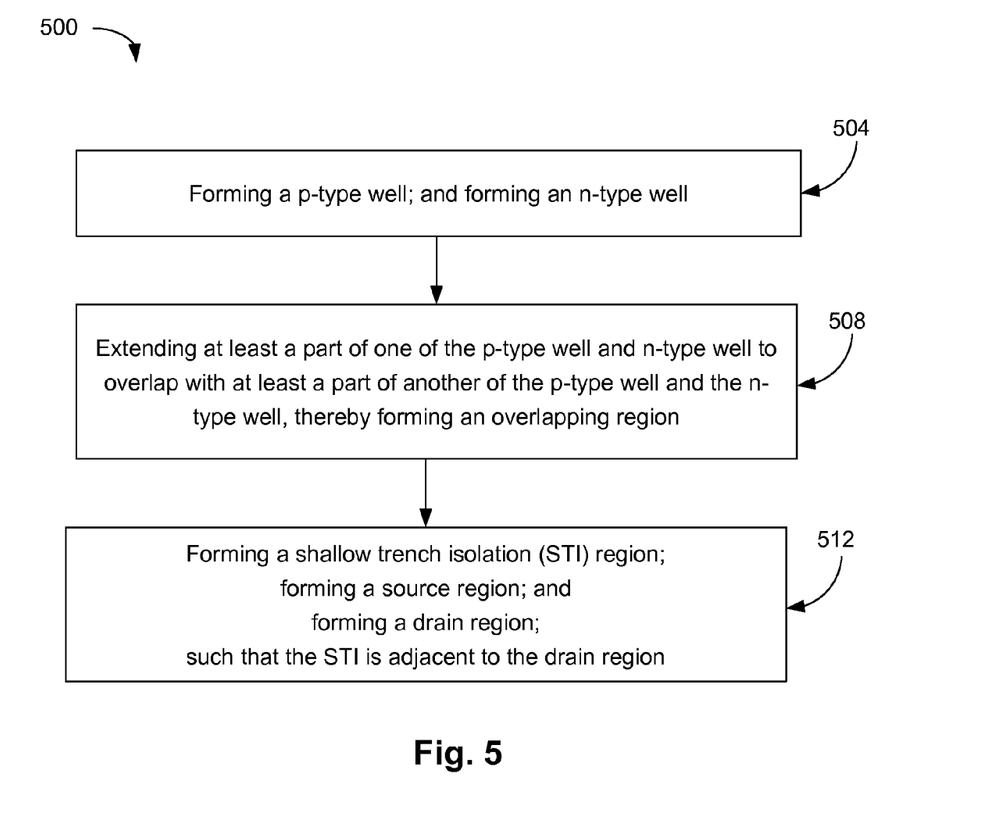
FIG. 5 illustrates an example of a method for forming a semiconductor device, in accordance with various embodiments of the present disclosure.

FIG. 5 illustrates an example of a method 500 for forming a semiconductor device (e.g., the LDMOS transistors of FIGS. 2-4), in accordance with various embodiments of the present disclosure. The method 500 includes, at 504, forming a p-type well (e.g., PW 120-2, PW 120-3, or PW 420), and forming an n-type well (e.g., NW-124-2, NW 124-3, or NW 424). In various embodiments, the p-type well is formed by doping a part of a substrate with a p-type dopant specie, and the n-type well is formed by doping another part of the substrate with an n-type dopant specie.

At 508, at least a part of one of the p-type well and n-type well is extended to overlap with at least a part of another of the p-type well and the n-type well, thereby forming an overlapping region (e.g., overlapping region 130-2, overlapping region 130-3, or overlapping region 130-4).

At 512, a shallow trench isolation (STI) region (e.g., 136-2, 136-3 or 136-4), a source region (e.g., source region 108-2, 108-3 or 108-4), and a drain region (e.g., drain region 112-2, 112-3 or 112-4) are formed, such that the STI region is adjacent to the drain region.

In various embodiments, the overlapping region is not in contact with the STI region or with the source region, as illustrated in FIGS. 2-4 (e.g., in the case the length Ld-2A is higher than Ld-2B in FIG. 2).

For example, in the case of the semiconductor device being in the form of LDNMOS 200 and/or 300, at least a part of the n-type well (e.g., NW 124-2 or 124-3), which is not included in the overlapping region (overlapping region 130-2 or 130-

3), separates the STI region (e.g., STI region 136-2 or 136-3) from the overlapping region, as illustrated in FIGS. 2 and 3. Similarly, at least a part of the p-type well (e.g., PW 120-2 or 120-3), which is not included in the overlapping region, separates the source region (e.g., source region 108-2 or 108-3) from the overlapping region.

In another example, in the case of the semiconductor device being in the form of LDPMOS 400, at least a part of the p-type well 420, which is not included in the overlapping region 130-4, separates the STI region 136-4 from the overlapping region 130-4; and at least a part of the n-type well 424, which is not included in the overlapping region 130-4, separates the source region 108-4 from the overlapping region 130-4.

However, in various other embodiments, the overlapping region may be in contact with the STI region (e.g., in the case the width of the overlapping region 130-2 is more than Ld-2A, and the overlapping region 130-2 partially covers the STI region 136-2).

In FIG. 5, one or more operations of one or more blocks may not necessarily be sequential in nature. For example, although illustrated as separate blocks, the extending operation at 508 may be part of one of the forming operations at 504. Similarly, one or more forming operations at 512 may be performed at least in part simultaneously with one or more operations at 504 and/or 508.

Although specific embodiments have been illustrated and described herein, it will be appreciated by those of ordinary skill in the art and others, that a wide variety of alternate and/or equivalent implementations may be substituted for the specific embodiment illustrated and described without departing from the scope of the present invention. This present invention covers all methods, apparatus, and articles of manufacture fairly falling within the scope of the appended claims either literally or under the doctrine of equivalents. This application is intended to cover any adaptations or variations of the embodiment discussed herein. Therefore, it is manifested and intended that the invention be limited only by the claims and the equivalents thereof.

What is claimed is:

1. A transistor comprising:
   a p-type well;
   an n-type well, wherein at least a part of the p-type well is extended into at least a part of the n-type well to form an overlapping region of the p-type well and the n-type well;
   a source region formed on the p-type well;
   a drain region formed on the n-type well;
   a gate region;
   a first shallow trench isolation region adjacent to the drain region; and
   a second shallow trench isolation region adjacent to the drain region,
   wherein at least a corresponding portion of each of (i) the first shallow trench isolation region and (ii) the second shallow trench isolation region is formed on the n-type well,
   wherein the overlapping region of the p-type well and the n-type well (i) at least partially covers the first shallow trench isolation region and (ii) covers an entire region underneath the gate region, and
   wherein the overlapping region of the p type well and the n type well does not cover the second shallow trench isolation region.

2. The transistor of claim 1, wherein the transistor is a laterally diffused n-type metal oxide semiconductor transistor.

3. The transistor of claim 1, wherein:
   the p-type well includes p-type dopant specie;
   the n-type well includes n-type dopant specie; and
   the overlapping region includes the p-type dopant specie and the n-type dopant specie.

4. The transistor of claim 1, wherein a width of the overlapping region is based at least in part on a desired drain voltage threshold level of the transistor.

5. A method for forming a transistor, the method comprising:
   forming an n-type well;
   forming a p-type well, wherein forming the p-type well further comprises
      extending at least a part of the p-type well to overlap with at least a part of the n-type well, thereby forming an overlapping region of the p-type well and the n-type well;
   forming a source region on the p-type well;
   forming a drain region on the n-type well;
   forming a gate region such that the overlapping region of the p type well and the n type well covers an entire region underneath the gate region; and
   forming a first shallow trench isolation region and a second shallow trench isolation region such that (i) each of the first shallow trench isolation region and the second shallow trench isolation region is adjacent to the drain region, (ii) at least a corresponding portion of each of the first shallow trench isolation region and the second shallow trench isolation region is formed on the n-type well, and (iii) the overlapping region of the p-type well and the n-type well at least partially covers the first shallow trench isolation region, while not covering any portion of the second shallow trench isolation region.

6. The method of claim 5,
   wherein forming the p-type well further comprises doping a part of a substrate with a p-type dopant specie; and
   wherein forming the n-type well further comprises doping another part of the substrate with an n-type dopant specie.

7. A semiconductor device comprising:
   a p-type well that includes a p-type dopant specie;
   an n-type well that includes an n-type dopant specie;
   an overlapping region formed between the p-type well and n-type well, wherein the overlapping region includes the p-type dopant specie and the n-type dopant specie;
   a source region formed on the p-type well;
   a drain region formed on the n-type well;
   a gate region;
   a first shallow trench isolation region adjacent to the drain region; and
   a second shallow trench isolation region adjacent to the drain region,
   wherein at least a corresponding portion of each of (i) the first shallow trench isolation region and (ii) the second shallow trench isolation region is formed on the n-type well,
   wherein the overlapping region (i) at least partially covers the first shallow trench isolation region and (ii) covers an entire region underneath the gate region, and
   wherein the overlapping region of the p type well and the n type well does not cover any portion of the second shallow trench isolation region.

8. The semiconductor device of claim 7, wherein the semiconductor device is a laterally diffused n-type metal oxide semiconductor (LDNMOS) transistor.

9. The semiconductor device of claim 7, wherein the overlapping region is formed by extending the p-type well to the n-type well.

10. The semiconductor device of claim 7, wherein a width of the overlapping region is based at least in part on a desired drain voltage threshold level of the semiconductor device.

11. The transistor of claim 1, further comprising:
 a third shallow trench isolation region adjacent to the source region.

12. The transistor of claim 11, wherein the overlapping region of the p type well and the n type well does not cover the third shallow trench isolation region.

13. The transistor of claim 1, wherein the first shallow trench isolation region is separate from the second shallow trench isolation region.

14. The transistor of claim 1, wherein the first shallow trench isolation region is separated from the second shallow trench isolation region by the drain region.

15. The transistor of claim 1, wherein the overlapping region of the p type well and the n type well does not cover any portion of the second shallow trench isolation region.

16. The transistor of claim 1, wherein the overlapping region of the p type well and the n type well is not adjacent to the second shallow trench isolation region.

\* \* \* \* \*